(12) United States Patent
Bemat et al.

(10) Patent No.: US 10,718,819 B2
(45) Date of Patent: Jul. 21, 2020

(54) POWER MODULE HEALTH TEST

(71) Applicant: Hewlett Packard Enterprise Development LP, Houston, TX (US)

(72) Inventors: Mohamed Amin Bemat, Cypress, TX (US); Daniel Humphrey, Tomball, TX (US); Michael Delany, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 370 days.

(21) Appl. No.: 15/746,882

(22) PCT Filed: Jul. 31, 2015

(86) PCT No.: PCT/US2015/043311
§ 371 (c)(1),
(2) Date: Jan. 23, 2018

(87) PCT Pub. No.: WO2017/023288
PCT Pub. Date: Feb. 9, 2017

(65) Prior Publication Data
US 2020/0103470 A1    Apr. 2, 2020

(51) Int. Cl.
*G01R 31/40* (2020.01)
(52) U.S. Cl.
CPC ................... *G01R 31/40* (2013.01)
(58) Field of Classification Search
CPC .. G01R 31/40; G01R 21/133; G01R 31/3842; G01R 27/2605; H02M 1/4208; H02M 3/33507
See application file for complete search history.

(56) References Cited

U.S. PATENT DOCUMENTS

| 8,564,989 | B2 | 10/2013 | Vogman |
| 2009/0072983 | A1 | 3/2009 | Cheng et al. |
| 2009/0072984 | A1 | 3/2009 | Cheng et al. |
| 2010/0128503 | A1 | 5/2010 | Liu et al. |
| 2013/0051095 | A1 | 2/2013 | Iwata |
| 2013/0154365 | A1 | 6/2013 | Sarti |
| 2014/0002033 | A1 | 1/2014 | Chen |
| 2014/0103937 | A1 | 4/2014 | Khan et al. |
| 2014/0354245 | A1 | 12/2014 | Batikoff et al. |

(Continued)

FOREIGN PATENT DOCUMENTS

| CN | 102044958 | 5/2011 |
| CN | 103940060 | 7/2014 |

OTHER PUBLICATIONS

Search Report and Written Opinion received for PCT Application No. PCT/US2015/043311, dated Apr. 28, 2016, 09 pages.

(Continued)

*Primary Examiner* — Alvaro E Fortich
*Assistant Examiner* — Zannatul Ferdous
(74) *Attorney, Agent, or Firm* — Hewlett Packard Enterprise Patent Department

(57) ABSTRACT

Various examples provide systems and methods in which a capacitor is charged by an active first power factor correction module and a voltage across the capacitor is determined while the second power factor correction module is exclusively active. A health state of the second power factor correction module may be determined based on the determined voltage across the capacitor.

15 Claims, 7 Drawing Sheets

(56) References Cited

U.S. PATENT DOCUMENTS

2016/0374168 A1* 12/2016 Ackmann .............. H05B 45/37
2017/0282747 A1* 10/2017 Wang ..................... B60L 53/14

OTHER PUBLICATIONS

"A One Stop Solution to Power Quality," NP Power UK, May 28, 2015, 2 pps., <http://www.nppowersolutions.com/services/power-factor>.

* cited by examiner

POWER MODULE HEALTH TEST

BACKGROUND

Power supplies are hardware components utilized to provide power to electrical loads, such as the various electronic components of a laptop, desktop, or server. Power supplies pull energy from an energy source, such as an electrical outlet or energy storage device, through a power input, convert the energy, and provide the converted energy to an electrical load through a power output. Generally, power supplies are designed to manage fluctuations in electrical current and to output a controlled and consistent current.

BRIEF DESCRIPTION OF THE DRAWINGS

The present application may be more fully appreciated in connection with the following detailed description taken in conjunction with the accompanying drawings, in which like reference characters refer to like parts throughout, and in which.

DETAILED DESCRIPTION

Figure 1:
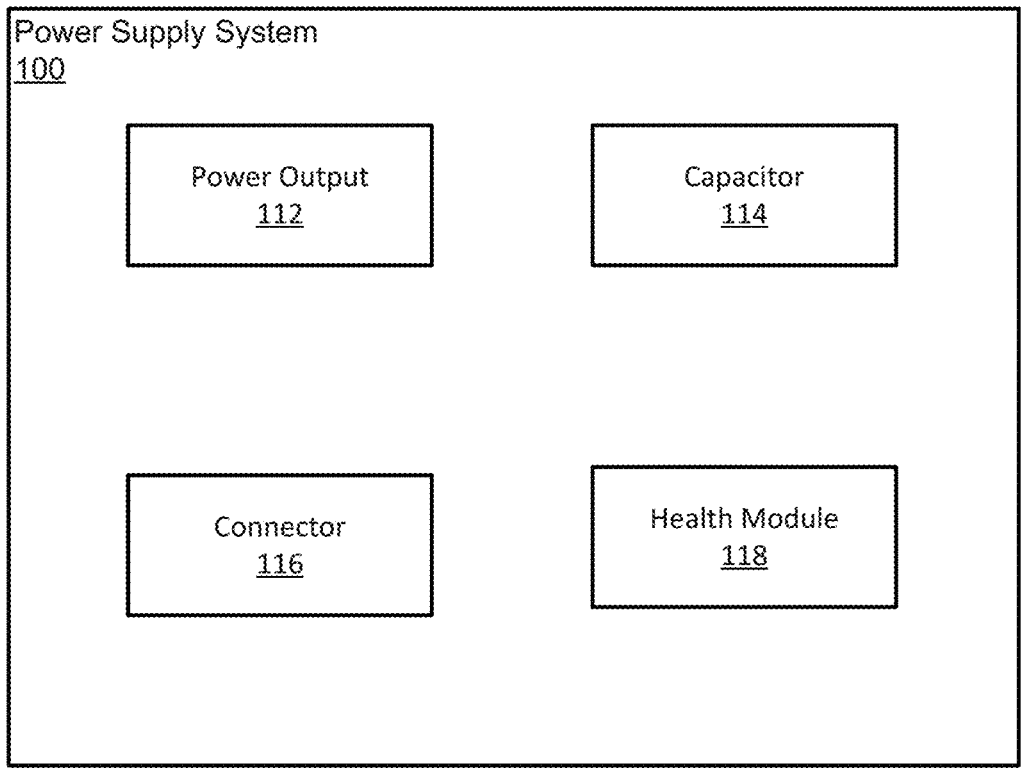
FIG. 1 is a block diagram of an example power supply system according to the present disclosure.

Power supplies, systems, methods, and equivalents associated with module health testing are described. Power supplies are devices used for converting and transferring energy from a power source to an electrical load. Power supplies may be characterized by electrical connectors in communication with a power factor correction module.

Power supplies may utilize power factor correction (PFC) modules for conversion of electrical current, such as from alternating current (AC) to direct current (DC), and/or for boosting the voltage inputted to a power supply system, such that the power supply system outputs a greater voltage than is inputted. This conversion process often places significant strain on a PFC module, therefore, a PFC module often has a heightened risk of failure relative to other components of a power supply system. Because a failure of a PFC module may result in a failure of an entire power supply system, redundancy in the power supply system is sometimes implemented by way of a second (standby) PFC module. In the event of a failure of a first PFC module that is active, the second PFC module can become active and take over the load previously carried by the first PFC module. The first and second PFC modules can be modularized such that a failure of one PFC module does not result in a failure of the entire power supply system. Additionally, modularized PFCs allow for a failed PFC module to be individually replaced with a healthy PFC module without having to replace the power supply system as a whole.

Unfortunately, where a power supply system does not monitor the health of its standby power factor correction (PFC) module, a failure of that standby PFC module may go undetected. This can result in a situation where an entire power supply system fails when there is an undetected failure of a standby PFC module and the primary PFC module fails. Accordingly, a power supply system capable of detecting the health state of an inactive PFC module is desired.

Various examples provided herein relate to systems and methods for health testing power factor correction (PFC) modules of a power supply system. To test a standby PFC module while ensuring that an electrical load supported by the power supply system continues to be supported during testing, the voltage across a capacitor of the power supply system is increased. Any active PFC modules are deactivated such that they no longer provide sufficient power to support the electrical load of the power supply system and the standby PFC module to be tested is activated. In the event where the standby PFC module is active but unable to provide sufficient power to support the electrical load of the power supply system (e.g., standby PFC module is unhealthy), the charged capacitor can support the electrical load. While the charged capacitor supports the electrical load, the electrical load may drain the capacitor and reduce its voltage. Where voltage across the capacitor is determined to have passed below a threshold, the standby PFC module may be deemed to be unhealthy. Additionally, where the voltage across the capacitor is determined to have passed below a threshold, the power supply system may deactivate the standby PFC module and activate a healthy PFC module (e.g., previously active PFC module). Conversely, where the voltage across the capacitor is determined to be above a threshold, the standby PFC module may be determined to be healthy. The foregoing can permit the health state of standby PFC modules to be tested while preventing certain power supply system failures during the test.

In the following description, for purposes of explanation, numerous specific details are set forth in order to provide a thorough understanding of the present systems and methods. For some examples, the present systems and methods may be practiced without these specific details. Reference in the specification to "an example" or similar language means that a particular feature, structure, or characteristic described in connection with that example is included as described, but may not be included in other examples. In other instances, methods and structures may not be described in detail to avoid unnecessarily obscuring the description of the examples. Also, the examples may be used in combination with each other.

"Module", as used herein, includes but is not limited to hardware, firmware, software stored on a computer-readable medium or in execution on a machine, or combinations of each to perform a function(s) or an action(s), or to cause a function or action from another module, method, or system. A module may include a software controlled microprocessor, a discrete module, an analog circuit, a digital circuit, a programmed module device, a memory device containing instructions, and so on. Modules may include one or more gates, combinations of gates, or other circuit components.

FIG. 1 illustrates a block diagram of an example power supply system 100 for implementation of power factor correction (PFC) module health detection. The power supply system 100 includes a power output 112, a capacitor 114, a connector 116, and a health module 118. Any of these components may be local to the power supply, or alternatively, may be remote to but in electrical communication with the power supply.

The power output 112 may output energy to an electrical load. The capacitor 114 may store an electrical voltage up to a specified maximum voltage inherent in the storage capacity of the capacitor 114, and may provide a consistent flow of current throughout the system by leveling out any fluctuations in electric current. Additionally, the capacitor 114 may output energy to the electrical load through the power output 112, provided there is a shortage in current across a parallel connector to the capacitor 114. In this way, when there is a failure of a PFC module providing power to the power supply system 100, the capacitor 114 may support the electrical load by temporarily providing power to the power supply system 100.

The connector 116 may function to provide an electrical connection between various components of the system. For example, the connector 116 may provide a parallel connection between the capacitor 114 and the power output 112. Similarly, the connector 116 may provide a parallel connection between the capacitor 114 and a plurality of power factor correction (PFC) modules which may or may not be included in the power supply system 100. The connector 116 may also provide a connection between the health module 118 and the capacitor 114 and/or between the health module 118 and a PFC module.

The connector 116 may take a variety of forms. For instance, the connector 116 may include electrical circuitry such as electrical wiring, or circuitry printed or embedded on a circuit board. Additionally, the connector 116 may include a backplane, such as a computer bus formed by a group of electrical connectors in parallel with each other so that each pin of each connector is linked to the same relative pin of each other connector. The backplane may be configured to receive any number of power factor correction (PFC) modules. Where the system is in communication with a plurality of PFC modules, one PFC module may be configured to have priority over another PFC module for supporting the electrical load. Specifically, the backplane may be configured to receive a first PFC module having active priority over a second PFC module such that the second PFC module may be configured in an idle state and supports the system only upon activation.

In one example, the backplane may house the capacitor 114 and/or the health module 118 locally, or may contain electrical inputs and outputs to receive electrical signals from the capacitor 114 and/or the health module 118 remotely. The health module 118 may take the form of a control module, such as a processor, and is configured to perform any number of steps for health detection of a power factor correction (PFC) module. Specifically, the health module 118 may activate or deactivate any number of PFC modules of the power supply system 100, including but not limited to, activating a first PFC module for charging the capacitor 114 to a predetermined voltage level, deactivating the first PFC module and exclusively activating a second PFC module (e.g., near simultaneously), and deactivating the second PFC module and activating the first PFC module (e.g., near simultaneously) where the second PFC module is determined to be unhealthy. The health module 118 may also determine a voltage level across the capacitor while the second PFC module is exclusively active, as well as determine a state of health of the second PFC module based on the determined voltage level. More detailed examples of the steps that may be implemented by the health module 118 are illustrated in the methods to follow. While the power supply system 100 can implement various example methods described herein, such methods may be implemented by any number of other systems. Additionally, any number of the steps carried out by the methods described herein may be implemented by a processor or control module, such as health module 118.

Figure 2:
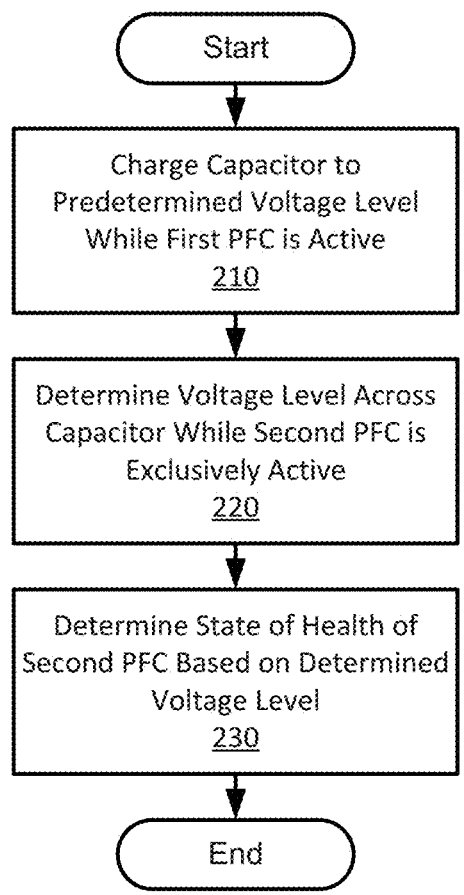
FIGS. 2 and 3 are flow charts illustrating example methods associated with power factor correction health testing according to the present disclosure.

FIG. 2. is a flow chart illustrating an example method associated with power factor correction (PFC) health testing according to the present disclosure. Although execution of the method is described below with reference to the example power supply system 100 of FIG. 1, the method may be executed by other suitable systems or devices. The method may be implemented in the form of executable instructions stored on a computer-readable medium or in the form of electronic circuitry. The sequence of operations described in connection with FIG. 2 is not intended to be limiting, and an implementation consistent with the example of FIG. 2 need not perform the sequence of operations in the particular order depicted.

In FIG. 2, the method begins at block 210, where the health module 118 may cause the capacitor 114 to charge to a predetermined voltage level. In one example, the health module 118 causes the capacitor 114 to charge by causing a PFC module such as the first PFC module, or any component that outputs charge, to charge the capacitor 114. The predetermined voltage level at which the capacitor is charged may be a voltage level sufficient for the capacitor 114 to support an electrical load coupled to the power supply system 100 via the power output 112, and to adequately do so for a time equal to or greater than a test period, as described in greater detail in FIG. 4. The capacitor 114 is charged to the predetermined voltage level while a first PFC module is active. In other words, while the capacitor 114 is charged, the first PFC module supports the electrical load through conversion of input voltage from AC to DC current and/or boosting the input voltage to a greater voltage level.

At block 220 the health module 118 may cause the voltage level across the capacitor 114 to be determined while a second PFC module is exclusively active. In one example, the voltage level across the capacitor 114 is determined by measuring the voltage level across the capacitor 114 over a predetermined time period, such as the predetermined test period discussed in FIG. 4 below. Where the determined voltage level across the capacitor 114 is less than the predetermined voltage level, the health module 118 may determine the amount of voltage drop across the capacitor 114. Similarly, where the determined voltage level across the capacitor 114 is less than the predetermined voltage level, the health module 118 may determine the rate of voltage drop across the capacitor 114.

At block 230 the health module 118 may determine the state of health of the second PFC module based on the determined voltage level. In the event the second PFC module is active but unhealthy, the second PFC module is unable to supply the necessary power to the electrical load and maintain the charge of the capacitor 114. As a result, the charged capacitor 114 can provide the necessary power to support the electrical load for a period of time necessary for activation of a healthy PFC module to support the electrical load. In supporting the electrical load, the voltage across the capacitor 114 may consequently drain. Therefore, the state of health of the second PFC module can be determined to be unhealthy where the voltage across the capacitor 114 is determined to have dropped below a certain value while the second PFC module is attempting to support the electrical load.

In one example, the state of health of the second PFC module is determined through comparison of the determined voltage level across the capacitor 114 to the predetermined voltage level. Alternatively, the state of health of the second PFC module is determined through comparison of the determined voltage level across the capacitor 114 to a threshold. For example, where the determined voltage level across the capacitor 114 is less than the threshold, or where the determined voltage level across the capacitor 114 is an amount of voltage less than the predetermined voltage level, the second PFC module is determined to be unhealthy. Conversely, where the determined voltage level is greater than or equal to the threshold, the second PFC module is determined to be healthy.

The threshold may be based on a minimum voltage required for the electrical load to operate reliably, or may be based on an input voltage to a PFC module, such as the second PFC module. Specifically, the threshold may be based on an amplitude of the input voltage to a PFC module. For example, the threshold may be a function of the root mean square (RMS) value of the input voltage to a PFC module, e.g. a product of the RMS value and the square root of two. Depending on the example, the input voltage to the PFC module may be in the form of direct current (DC) or alternating current (AC).

In one example, the health module 118 determines the threshold. For instance, the health module 118 may determine the threshold to be a predetermined threshold having a value that reflect the minimum voltage required for the electrical load to operate reliably. In another instance, the health module 118 may determine the threshold to be a conditional threshold having a value based on the current input voltage to a PFC module.

The health module 118 may determine the threshold to be the predetermined threshold or the conditional threshold based on a condition, such as whether the current input voltage to a PFC module is greater than the minimum voltage required for the electrical load to operate reliably. The health module 118 may determine the threshold to be conditional threshold where the current input voltage is greater than the minimum voltage, and determine the threshold to be the predetermined threshold otherwise.

Accordingly, the health module 118 may actively monitor the input voltage to the PFC module or the minimum voltage required for the electrical load to operate reliably. In particular, while the threshold is the predetermined threshold, the health module 118 may monitor the current input voltage such that if at any time the condition (of the current voltage being greater than the minimum voltage) is met, the health module 118 switches the threshold from the predetermined threshold to the conditional threshold. Similarly, while the threshold is the conditional threshold, the health module 118 may monitor the threshold such that if at any time the condition is not met, the health module 118 switches the threshold from the conditional threshold to the predetermined threshold.

By such monitoring and dynamic selection, various examples can avoid false positives at the state of health determination step at block 230. Such false positive may result where the power factor correction (PFC) module to be tested (e.g., a second PFC module) includes some form of bypass mechanism that causes input voltage the PFC module receives to be bypassed through the PFC module when the input voltage to the PFC module is greater than the predetermined threshold. As a result, this can cause a false positive to arise where the amplitude of the input voltage to the PFC module to be tested is greater than the predetermined threshold. These false positives may be avoided where the threshold dynamically switches from the predetermined threshold to the conditional threshold based on the input voltage to the PFC module to be tested.

Figure 3:
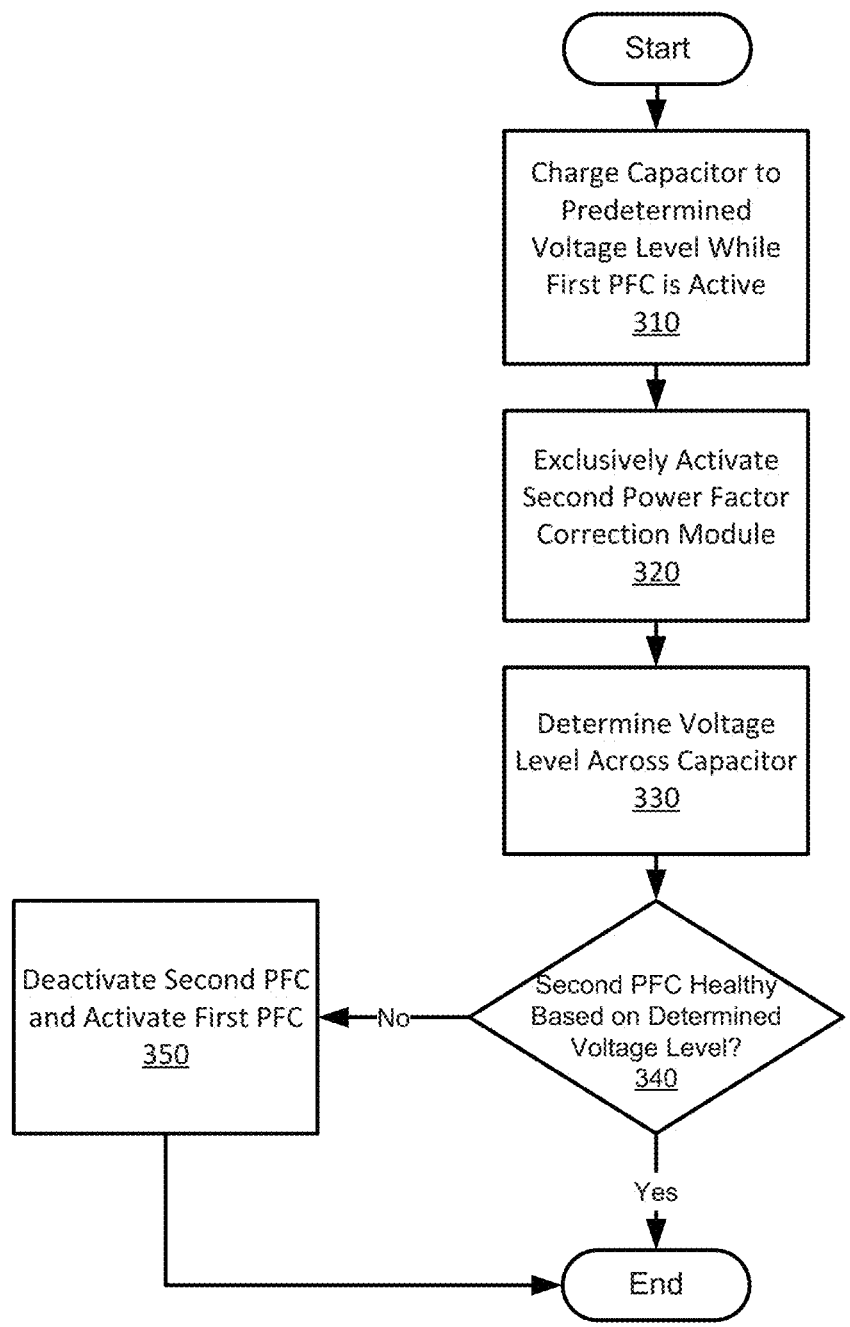

FIG. 3 is a flow chart illustrating an example method associated with power factor correction (PFC) health testing according to the present disclosure. Although execution of the method is described below with reference to the example power supply system 100 of FIG. 1, the method may be executed by other suitable systems or devices. The method may be implemented in the form of executable instructions stored on a computer-readable medium or in the form of electronic circuitry. The sequence of operations described in connection with FIG. 3 is not intended to be limiting, and an implementation consistent with the example of FIG. 3 need not perform the sequence of operations in the particular order depicted.

In FIG. 3, the method begins at block 310, where the capacitor 114 is charged, in one example by the health module 118, to a predetermined voltage level sufficient for the capacitor 114 to support an electrical load coupled to the power supply system 100 via the power output 112. In one example the capacitor 114 is charged while a first PFC module is active such that the first PFC module outputs power to the power supply system 100 via the connector 116. The capacitor 114 may be charged by the first PFC module or by any component that outputs charge. In one example, the first PFC module is activated to charge the capacitor 114 to the predetermined voltage level.

At block 320, the first PFC module is deactivated, in one example by the health module 118, such that it no longer outputs power to the power supply system 100, and the second PFC module is activated, in one example by the health module 118, such that the second PFC module is the only active PFC module. In other words, the second PFC module is exclusively active such that the second PFC module is the only PFC module providing power to the capacitor 114 and the power output 112. With the second PFC module exclusively active, at block 330 the voltage level across the capacitor 114 is determined and at block 340 the state of health of the second PFC module is determined from the determined voltage level across the capacitor. In one example, the determination of the voltage level across the capacitor 114 and/or the determination of the state of health of the second PFC module is determined by the health module 118.

At block 350, the second PFC module may be deactivated and the first PFC module may be activated where the second PFC module is determined to be unhealthy. This may ensure that power is continuously provided to an electrical load of the power supply system 100 and any potential electrical load downtime is avoided. Upon determination of the state of health of the second PFC module to be unhealthy, or upon deactivation of the second PFC module and activation of the first PFC module, the health module 118 may flag the second PFC module as unhealthy. Similarly, the health module 118 may flag the second PFC module as healthy upon determination of the state of health of the second PFC module to be healthy. In one example, the second PFC module remains a standby PFC module regardless of its determined state of health. Thus, the first PFC module may be activated and the second PFC module may be deactivated even upon determination of a healthy second PFC module.

Figure 4:
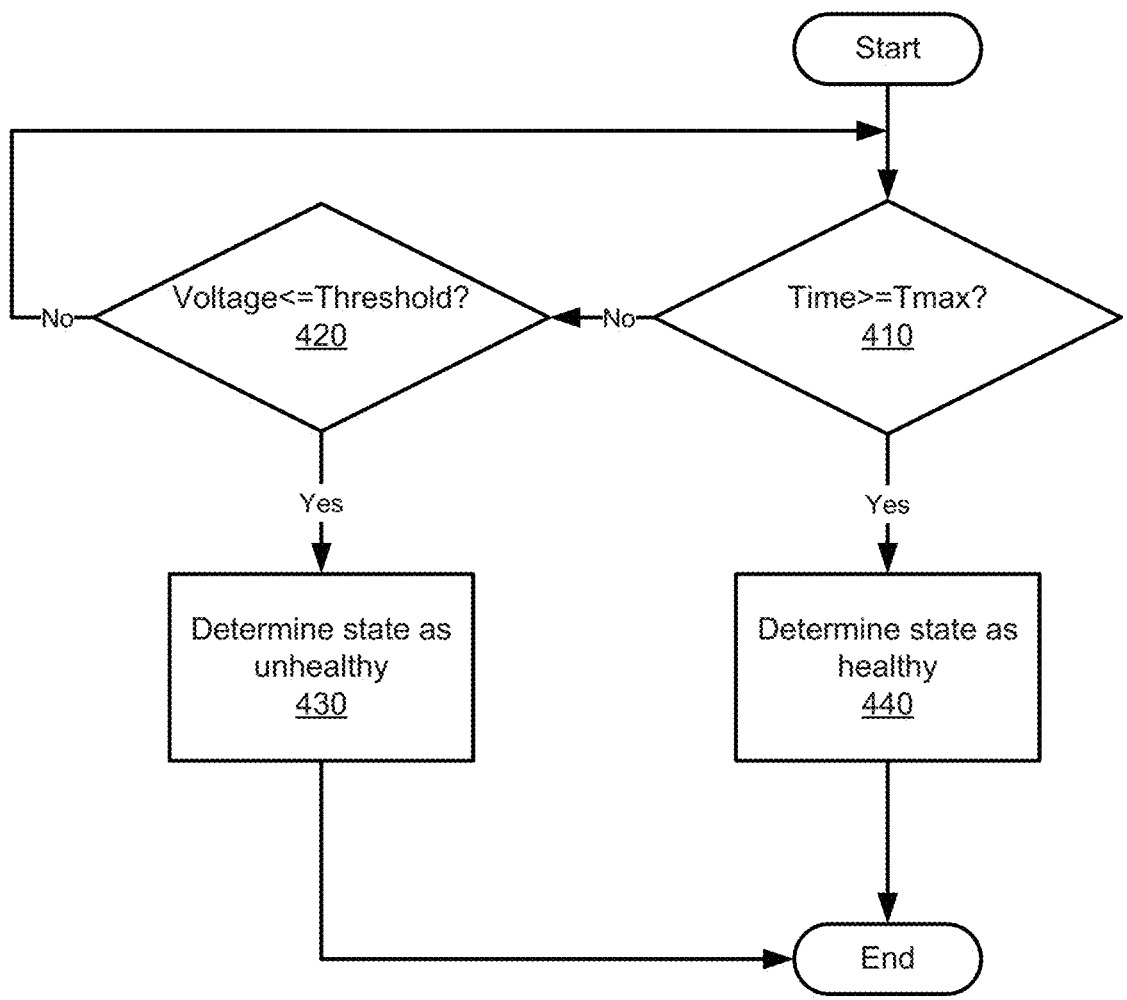
FIG. 4 is a flowchart illustrating an example method associated with health state determination according to the present disclosure.

FIG. 4 is a flowchart illustrating an example method associated with health state determination of a power factor correction (PFC) module. Although execution of the method is described below with reference to the example power supply system 100 of FIG. 1, the method may be executed by other suitable systems or devices. The method may be implemented in the form of executable instructions stored on a computer-readable medium or in the form of electronic circuitry. The sequence of operations described in connection with FIG. 4 is not intended to be limiting, and an implementation consistent with the example of FIG. 4 need not perform the sequence of operations in the particular order depicted.

The state of health of a power factor correction (PFC) module coupled to the power supply system 100 via the connector 116 may be determined, in one example by the health module 118, by measuring the voltage level across a capacitor 114 over a predetermined time period, referred to in FIG. 4 as "Tmax." Specifically, at block 410 it is determined whether a passage of testing time, referred to in FIG. 4 as "Time," is greater than or equal to Tmax. Where Time is not greater than or equal to Tmax, the testing process continues, and at block 420 it is determined whether the voltage level across the capacitor 114 is less than or equal to a threshold value. The voltage level across the capacitor 114 being not less than or equal to the threshold signals a return to block 410. Conversely, where the voltage level across the capacitor 114 is less than or equal to the threshold, at block 430 the state of health of the tested PFC module is determined to by unhealthy. Where Time is greater than or equal to Tmax, at block 440 the state of health of the tested PFC module is determined to be healthy. Accordingly, the state of health of a PFC module may be determined over a predetermined time through periodic determination of a voltage level across the capacitor 114.

Figure 5:
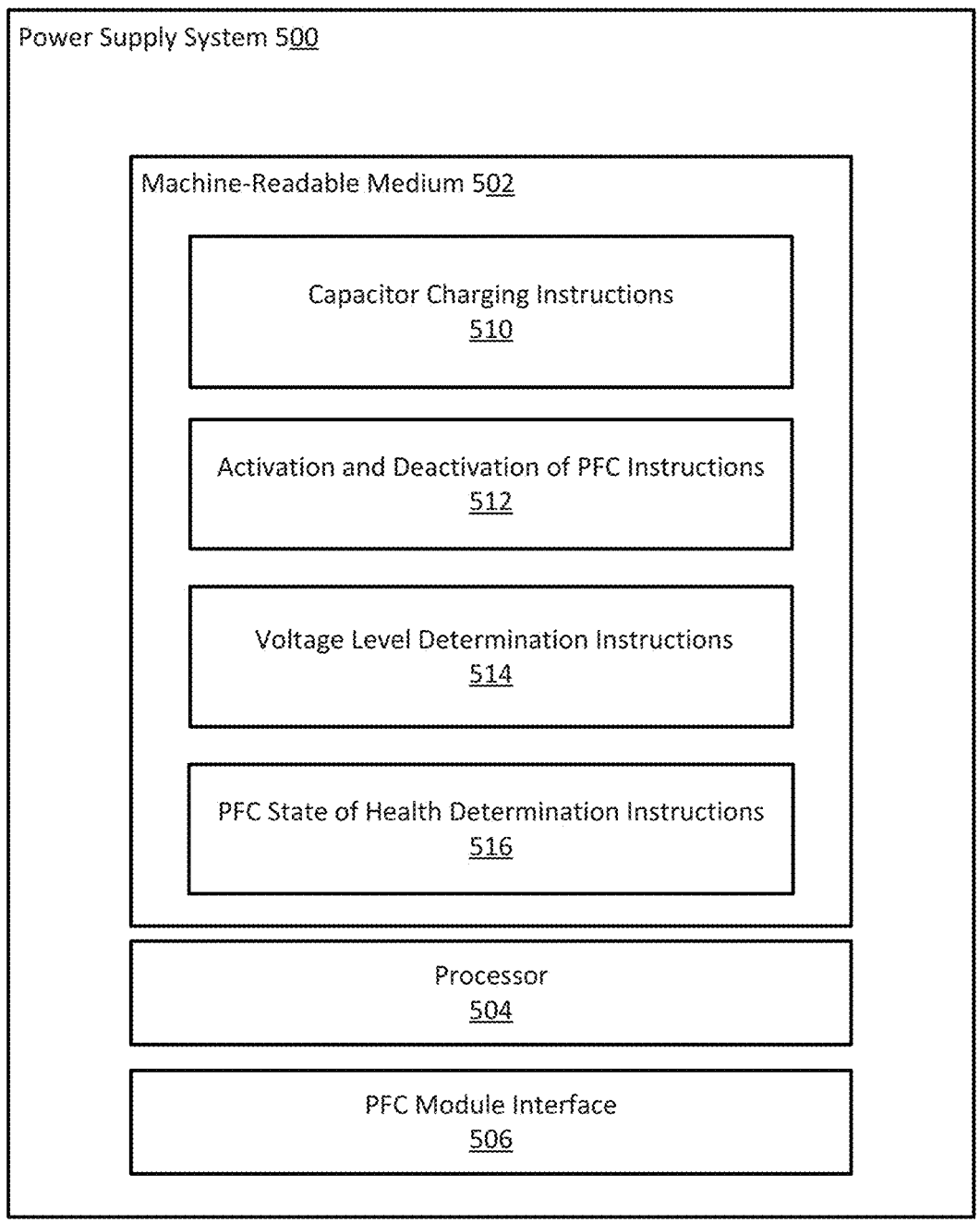
FIGS. 5 and 6 are block diagrams of example power supply systems according to the present disclosure.

FIG. 5 is a block diagram of an example power supply system 500 according to the present disclosure may operate. In particular, the example power supply system 500 may determine the state of health of a second power factor correction (PFC) module, such as a standby PFC module. As illustrated, the power supply system 500 includes a machine-readable medium 502, a processor 504, and a PFC module interface 506. While FIG. 5 illustrates one example arrangement of a power supply system, any number of components and various other arrangements of the components may be utilized.

The machine-readable medium 502 stores executable instructions for state of health determination of a PFC module, and may be any electronic, magnetic, optical, or other physical storage device that stores executable instructions. For instance, the machine-readable medium 502 may be a Random Access Memory (RAM), an Electrically-Erasable Programmable Read-Only Memory (EEPROM), a storage drive, an optical disc, or any other like device. The computer-readable medium can be encoded to store executable instructions that cause the processor 504 to perform operations in accordance with various examples described herein. In various examples, the machine-readable medium 502 is non-transitory. As shown in FIG. 5, the machine-readable medium 502 includes capacitor charging instructions 510, activation and deactivation of PFC instructions 512, voltage level determination instructions 514, and PFC state of health determination instructions 516.

The processor 504 may be one or more central processing units (CPUs), microprocessors, or other hardware devices suitable for retrieval and execution of one or more instructions stored in the machine-readable medium 502. The processor 504 may fetch, decode, and execute the instructions 510, 512, 514, and 516 to enable the power supply system 500 to perform operations in accordance with various examples described herein. For some examples, the processor 504 includes one or more electronic circuits comprising a number of electronic components for performing the functionality of one or more of the instructions 510, 512, 514, and 516.

The capacitor charging instructions 510 may cause the processor 504 to cause a first PFC module, which may or may not be included in the power supply system 500, to charge the capacitor 114 to a predetermined voltage level. In one example, the capacitor charging instructions 510 may cause the processor 504 to cause the capacitor 114 to charge while the first PFC module is active. In another example, the capacitor charging instructions 510 may cause the processor 504 to cause any number of other components having a charge output to charge the capacitor 114 to the predetermined voltage level. The predetermined voltage level may be a voltage level sufficient to support an electric load of the power supply system 500 where an active power factor correction (PFC) module previously supporting the system is deactivated.

The activation and deactivation of PFC instructions 512 may cause the processor 504 to activate and/or deactivate any number of PFC modules, including causing the processor 504 to activate a second PFC module and deactivate the first PFC module. The activation and deactivation of PFC instructions 512 may deactivate all active PFC modules of a plurality such that the second PFC module is exclusively active. In another example, the activation and deactivation of PFC instructions 512 may cause the processor 504 to deactivate the second PFC module and activate the first PFC module responsive to a determination of a state of health of the second PFC module.

The voltage level determination instructions 514 may cause the processor 504 to determine a voltage level across the capacitor 114 while the second PFC module is active and exclusively charging the capacitor 114. In one example, the voltage level determination instructions 514 may cause the processor 504 to determine the voltage level across the capacitor 114 such that, the processor 504 measures the voltage level across the capacitor 114, or any other component local or remote to the power supply system 500 and capable of measuring voltage measures the voltage across the capacitor 114.

The PFC state of health determination instructions 516 may cause the processor 504 to determine a state of health of the second power factor correction (PFC) module based on the determined voltage level. In one example, the PFC state of health determination instructions 516 may cause the processor 504 to determine the state of health of the second PFC module responsive to the activation and deactivation of PFC instructions 512 causing the processor to deactivate the second PFC module and activate the first PFC module. Furthermore, the PFC state of health determination instructions 516 may cause the processor 504 to determine the state of health of the second PFC module to be healthy or unhealthy based on the determined voltage level. For example, the PFC state of health determination instructions 516 may cause the processor 504 to determine the state of health of the second PFC module to be healthy where the determined voltage level is greater than or equal to a threshold. Similarly, the PFC state of health determination instructions 516 may cause the processor 504 to determine the state of health of the second PFC module to be unhealthy where the determined voltage level is less than the threshold.

Figure 6:
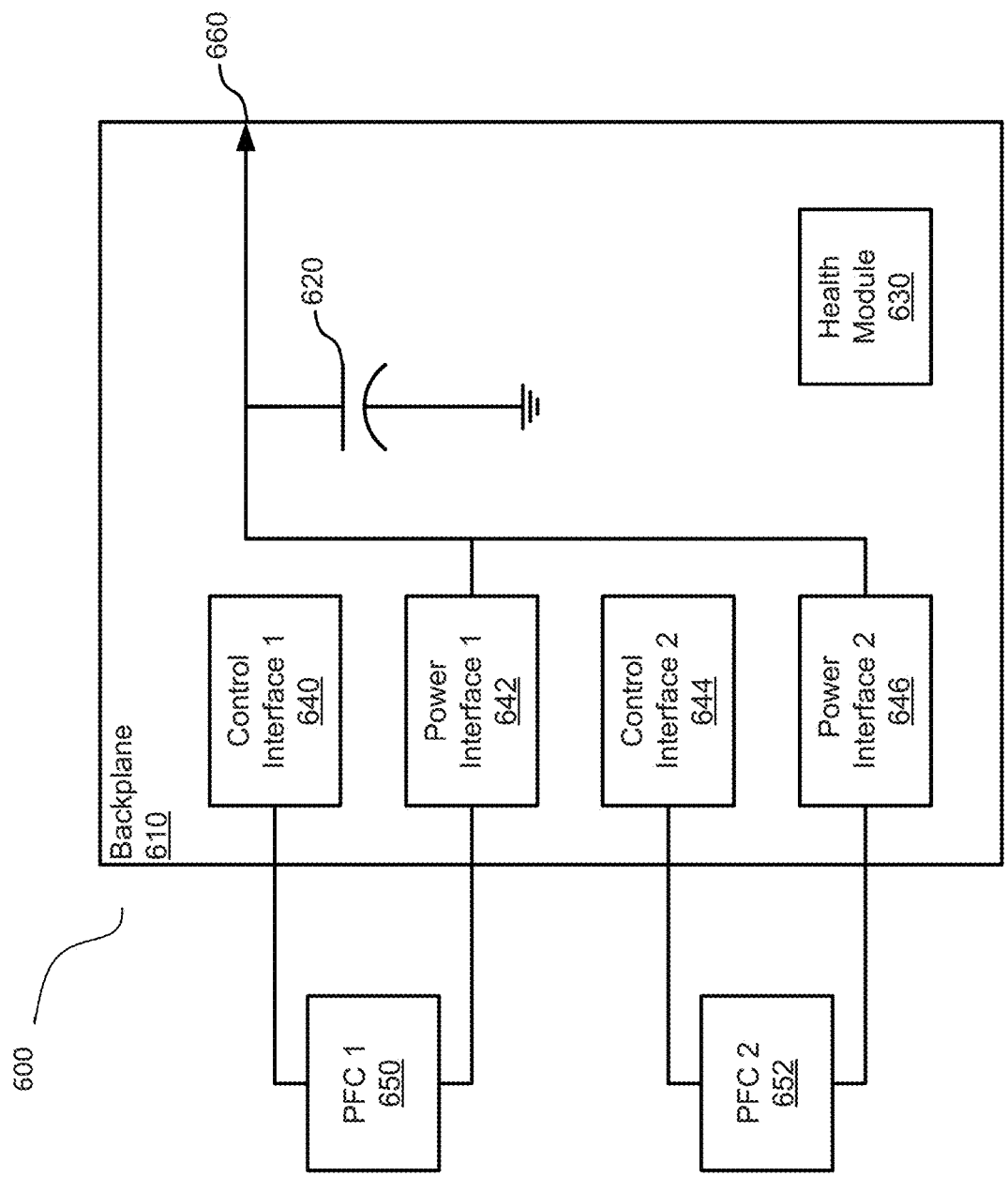

FIG. 6 is a block diagram of an example power supply system 600 according to the present disclosure may operate. In particular, the example power supply system 600 may determine the state of health of a power factor correction (PFC) module. As illustrated, the power supply system 600 includes a backplane 610, which may provide an example connector for enabling communication between the various components of the power supply system 600. As shown, those various components can include: the capacitor 620; the health module 630; any number of power factor correction (PFC) modules, such as PFC module 1 (650) and PFC module 2 (652); and the various interfaces, such as control interface 1 (640), power interface 1 (642), control interface 2 (644), and power interface 2 (646). For some examples, the backplane 610 may provide connections between the capacitor 620, PFC module 1 (650), and the health module 630, to enable PFC module 1 (650) to charge the capacitor 620 as directed by the health module 630. Similarly, the backplane 610 may provide connections between the capacitor 620, PFC module 2 (652), and the health module 630, to enable PFC module 2 (652) to charge the capacitor 620 as directed by the health module 630.

The backplane 610 may also provide the necessary connections to perform a variety of other functions for determining the state of health of a PFC module. For instance, the backplane 610 may provide the necessary connection between the health module 630, PFC module 1 and PFC module 2, 650 and 652 respectively, and any additional PFC modules such that the health module can activate or deactivate any number of PFC modules for determining the health state of a standby PFC module. The backplane 610 may also provide the necessary connection between the health module 630 and the capacitor 620 such that a voltage level across the capacitor 620 can be determined, for example by the health module 630, and between the health module 630 and the second PFC module such that the state of health of the second PFC module can be determined, for example by the health module 630.

PFC module 1 and PFC module 2, 650 and 652 respectively, are illustrated as example PFC modules that may or may not be included by the power supply system 600. Power interface 1 and power interface 2, 642 and 646 respectively, are included as example power inputs for receiving power from a PFC module in electrical communication with a respective power interface. Similarly, control interface 1 and control interface 2, 640 and 644 respectively, are included as example signal inputs or example signal outputs that permit exchange of data between components of the backplane 610 and a PFC module in electrical communication with a respective control interface. For example, a control interface may send a Power System On signal to a respective PFC module for activation of the PFC module, and the PFC module may send a Present signal to the respective control interface to confirm to the system that the PFC module has been activated. While FIG. 6 shows a first and second power and control interface, any number of power interfaces and control interfaces may be included in the power supply system 600, thereby enabling the exchange of signals with and reception of power from any number of PFC modules.

In one example, each control interface and power interface is modularized such that they are in distinct communication with a respective PFC module. In this way, a failure of a PFC module may not result in a failure of any other control interface or power interface in communication with a different PFC module. For example, each PFC module may be modularized such that a failure of PFC module 1 (650) does not result in a failure of PFC module 2 (652) or any other component not part of a module of PFC module 1 (650). Additionally, each PFC module may comprise two separate high voltage DC lines coupled to the capacitor 620, with only one PFC module providing power to the capacitor 620 at any given time.

Any number of power factor correction (PFC) modules may be hot swappable, such that a PFC module may be replaced while the system remains in operation with at least one active PFC module. In one example, the connector detects the reception of a PFC module and, responsive to the connector receiving a PFC module, any of the example health tests illustrated in FIG. 2, FIG. 3, and FIG. 4 may be performed with respect to the detected PFC module. Accordingly, the system 600 may enable replacement of a failed PFC module without interruption of the operations of an electrical load coupled to the power supply system 600.

Figure 7A:
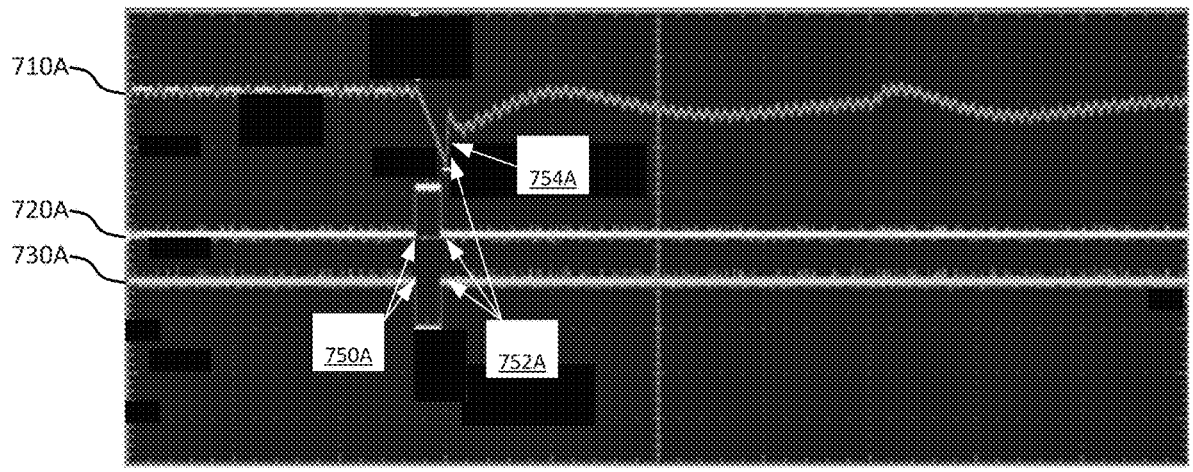
FIG. 7A and FIG. 7B are charts illustrating example voltage readings associated with unhealthy and healthy power factor correction modules according to the present disclosure.
Figure 7B:
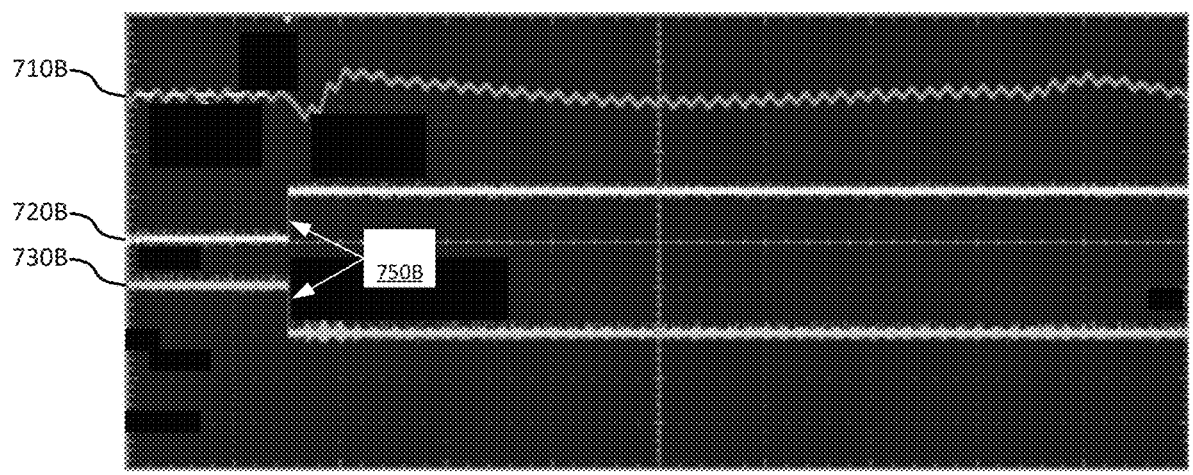

FIG. 7A and FIG. 7B are charts illustrating example voltage readings associated with power factor correction (PFC) modules according to the present disclosure. Specifically, FIG. 7A illustrates example voltage readings associated with an example environment including an unhealthy standby PFC module, and FIG. 7B illustrates example voltage readings associated with an example environment including a healthy standby PFC module. Where numerical references to the drawings do not specifically refer to FIG. 7A or FIG. 7B specifically, but only to FIG. 7, it should be understood that the numerical reference refers to both FIG. 7A and FIG. 7B. The following description of FIG. 7A and FIG. 7B makes reference to power supply system 100 as one example system, however, the example charts of FIG. 7A and FIG. 7B may be applicable to other systems.

The charts illustrated in FIG. 7A and FIG. 7B include line segments representing determined voltage levels across the capacitor 114 for determination of the state of health of a power factor correction (PFC) module of a power supply system such as the power supply system 100 of FIG. 1. Specifically, the line segment 710 representing the voltage across the capacitor 114 is illustrated as a function of time alongside the line segment 720 representing the voltage across a first PFC module and the line segment 730 representing the voltage across a second PFC module. Prior to activating the second PFC module and deactivating the first PFC module at moment 750, the power supply system 100 is powered by the first PFC module. While the first PFC module is activated, line segments 710, 720, and 730 show the voltage level across the capacitor 114, first PFC module, and second PFC module respectively, as relatively steady. Some voltage fluctuation is expected at the moment at which a PFC module is activated or deactivated 750.

Specifically, FIG. 7A illustrates example voltage readings associated with an example environment including an unhealthy standby PFC module. Moment 752A illustrates a point at which the voltage across the capacitor 114 drops below a threshold. The threshold may be a minimum voltage required for the electrical load to operate reliably, or may be an input voltage to a PFC module, such as the second PFC module. This voltage drop at moment 752A indicates that the second PFC module is unhealthy. Specifically, the voltage drop at moment 752A indicates a failure of the second PFC module to support an electrical load coupled to a power output 112 of the power supply system 100. At moment 752A the state of health of the second PFC module is determined to be unhealthy, and the subsequent rise in voltage 654A indicates that the determined state of health of the second PFC module was unhealthy, a healthy PFC module was activated, such as the first PFC module, and the second PFC module was deactivated. In one example, the health module 118, responsive to a determined voltage level across the capacitor 114 being lower than a threshold, deactivates the second PFC module and activates the first PFC module.

Conversely, FIG. 7B illustrates example voltage readings associated with an example environment including a healthy standby PFC module. Upon activation of the second PFC module and deactivation of the first PFC module 750B, the voltage across the capacitor 114 does not drop below a threshold. Rather, the healthy second PFC module is able to provide sufficient power to support the electrical load. In this example the second PFC module remains exclusively active. However, in other instances the second PFC module may be deactivated and the first PFC module may be activated responsive to determining the state of health of the second PFC module to be healthy. In one example, the health module 118 deactivates the second PFC module and activates the first PFC module responsive to determining the state of health of the second PFC module to be healthy.

In the foregoing description, numerous details are set forth to provide an understanding of the subject disclosed herein. However, various examples may be practiced without some or all of these details. Some examples may include modifications and variations from the details discussed above. It is intended that the appended claims cover such modifications and variations.

What is claimed is:

1. A power supply comprising:
   a power output; a capacitor;
   a connector to couple a plurality of power factor correction modules, implemented in a circuitry, in parallel with the capacitor and the power output; and
   a health module to:
   cause the capacitor to charge to a predetermined voltage level by at least a first power factor correction module of the plurality of power factor correction modules while the first power factor correction module is providing power to the capacitor;
   determine a voltage level across the capacitor while the power output is coupled to an electrical load and while a second power factor correction module is exclusively providing power through the connector to both the capacitor and the power output; and
   determine a state of health of the second power factor correction module based on the determined voltage level.

2. The power supply of claim 1, wherein the health module is to determine the voltage level across the capacitor by measuring the voltage level across the capacitor over a predetermined time period.

3. The power supply of claim 1, wherein the health module is to determine the state of health of the second power factor correction module based on the determined voltage level by comparing the determined voltage level to the predetermined voltage level.

4. The power supply of claim 3, wherein the health module is to determine an amount of voltage drop of the capacitor in response to the determined voltage level across the capacitor being less than the predetermined voltage level.

5. The power supply of claim 3, wherein the health module is to determine a rate of voltage drop of the capacitor in response to the determined voltage level across the capacitor being less than the predetermined voltage level.

6. The power supply of claim 1, wherein the determined state is healthy when the determined voltage level is greater than a threshold voltage, and the determined state is unhealthy when the determined voltage level is less than the threshold voltage.

7. The power supply of claim 6, wherein the threshold voltage is based on an input voltage to at least the second power factor correction module of the plurality of power factor correction modules.

8. The power supply of claim 1, wherein to cause the capacitor to be charged to the predetermined voltage level by the first power factor correction module, the health module is to cause the first power factor correction module to activate.

9. The power supply of claim 1, wherein the health module is to cause exclusive activation of the second power factor correction module in the plurality of power factor correction modules, the second power factor correction module exclusively providing power to the capacitor and the power output when the second power factor correction module is exclusively active.

10. The power supply of claim 1, wherein the health module is to activate the second power factor correction module in response to at least one connector receiving the second power factor correction module.

11. A method comprising:
    charging a capacitor to a predetermined voltage level by a first power factor correction module of a plurality of power factor correction modules, implemented in a circuitry, while the first power factor correction module is active, the plurality of power factor correction modules and the capacitor being coupled in parallel to an electrical load through a power output;
    determining a voltage level across the capacitor while a second power factor correction module is exclusively active in the plurality of power factor correction modules, the second power factor correction module exclusively providing power to the capacitor and to the electrical load through the power output when the second power factor correction module is exclusively active; and
    determining a state of health of the second power factor correction module based on the determined voltage level.

12. The method of claim 11, further comprising exclusively activating a second power factor correction module in the plurality of power factor correction modules.

13. The method of claim 11, wherein the determined state is healthy when the determined voltage level is greater than a threshold voltage, and the determined state is unhealthy when the determined voltage level is less than the threshold voltage.

14. The method of claim 11, further comprising deactivating the second power factor correction module and activating the first power factor correction module when the determined state is unhealthy.

15. A non-transitory machine-readable medium having instructions stored thereon, the instructions being executable by a processor of a power supply system, the instructions causing the processor to:
    cause a first power factor correction module of a plurality of power factor correction modules, implemented in a circuitry, to charge a capacitor of the power supply system to a predetermined voltage level while the first power factor correction module is active;
    after the capacitor is charged to the predetermined voltage level, activate a second power factor correction module of the plurality of power factor correction modules while deactivating all other power factor correction modules of the plurality of power factor correction modules;
    determine a voltage level across the capacitor while the second power factor correction module is active and exclusively charging the capacitor; and
    determine a state of health of the second power factor correction module based on the determined voltage level.

* * * * *